United States Patent [19]
Braithwaite et al.
[11] 4,310,796
[45] Jan. 12, 1982

[54] MAGNET ASSEMBLIES WITH PLURAL METALLIC FOIL CONTACT MEMBERS FOR PIPELINE INSPECTION VEHICLES

[75] Inventors: John C. Braithwaite, Ponteland; David J. McGee, Barns Park, both of England

[73] Assignee: British Gas Corporation, London, England

[21] Appl. No.: 80,522

[22] Filed: Oct. 1, 1979

[30] Foreign Application Priority Data

Oct. 2, 1978 [GB] United Kingdom ............... 38915/78

[51] Int. Cl.[3] ....................... G01R 33/12; G01N 27/82

[52] U.S. Cl. ..................................................... 324/220

[58] Field of Search ............... 324/217, 218, 219, 220, 324/221, 228-231, 260-262, 149, 158 P, 346, 368, 54; 335/281, 219

[56] References Cited

U.S. PATENT DOCUMENTS 3,539,915 11/1970 Walters et al. ...................... 324/220
3,593,122 7/1971 Barton et al. ........................ 324/220
3,786,684 1/1974 Wiers et al. ...................... 324/220 X
3,967,194 6/1976 Beaver et al. ........................ 324/220
4,105,972 8/1978 Smith .................................. 324/220
4,117,402 9/1978 Zangger et al. ................ 324/231 X
4,227,149 10/1980 Faure et al. ...................... 324/158 P

FOREIGN PATENT DOCUMENTS 359432 10/1931 United Kingdom ................ 324/217

*Primary Examiner*—Gerard R. Strecker
*Attorney, Agent, or Firm*—Watson, Cole, Grindle & Watson

[57] ABSTRACT

A magnetic coupling member for a magnet assembly of a pipeline inspection vehicle comprising one or more stacks of foils arranged as multi-layer laminations interleaved with short spacers and clamped together between clamping blocks by bolts. The assembly of clamped-together stack of foils is secured to the magnet of the vehicle magnet assembly by removable bolts which enable easy replacement of worn or damaged stacks of foils.

15 Claims, 6 Drawing Figures

MAGNET ASSEMBLIES WITH PLURAL METALLIC FOIL CONTACT MEMBERS FOR PIPELINE INSPECTION VEHICLES

BACKGROUND OF THE INVENTION

1. Field of the Invention

This invention relates to pipeline inspection vehicles of the type which can be inserted into a pipeline of ferro-magnetic material and carried along by the fluid flow in the pipeline to detect defects in the pipeline wall, and in particular the invention relates to the magnet assemblies used in such vehicles.

2. The Prior Art

Pipeline inspection vehicles of the kind with which the present invention is particularly concerned usually include a plurality of magnet assemblies supported around the body of the vehicle, which assemblies are arranged to engage the internal surface of the pipeline wall during movement of the vehicle along the pipeline under test so as to permeate an area of the wall with a magnetic flux and thereafter detect any anomalies in the magnetic field adjacent the wall caused by flux leakage from defects in the wall. Usually, each magnet assembly consists of a magnet and a coupling member of flux-conducting material suitably shaped for coupling the magnet to the wall so that a magnetic circuit is obtained.

The magnetic requirements for a coupling member are that the magnetic reluctance thereof should be low, i.e., to minimize the strength requirement of the magnet, and it should not vary significantly when traversing obstructions, for example, welds or steps in the pipeline bore or when passing around bends in the pipeline itself.

In practice, these requirements have been adequately fulfilled by using coupling members composed of steel bristles. The bristles are densely packed to give a large metal area, and the length and diameter of the bristle wires are optimized to give an adequate combination of stiffness and flexibility. The stiffness is required to provide load-carrying capacity, whereas the flexibility is required to provide a smooth transition over girth welds and other obstructions in the pipeline wall.

There are a number of disadvantages associated with such steel bristle members. For example, the manufacturing costs associated with producing the very densely packed bristles are high and the service life is limited due to abrasive wear in use. This means that the bristle replacement costs are significant. Breakage of individual wires, caused by weakening due to corrosion pitting (caused by water in the pipeline or associated with the steam cleaning process to which the vehicles are subjected after a service run in the pipeline), is also a problem.

It is an object of the present invention to provide an improved magnetic coupling member of a magnet assembly for a pipeline inspection vehicle which, as compared to steel bristle coupling members, is cheaper to construct; is easier to disassemble from the magnet assembly and replace when required; has more metal per unit area and hence lower reluctance; enables a wider choice of metal or metal alloys to be used; and is less subject to corrosion and more resistant to abrasive wear.

SUMMARY OF THE INVENTION

According to the present invention, the magnetic coupling member for the magnet assembly of a pipeline inspection vehicle includes one or more stacks containing a plurality of foils of metal or metal alloy, the foils being clamped together at their base regions, and the stacks being removably secured to an associated permanent magnet.

Preferably, the or each stack includes spacer members interleaved between the foils at the base regions thereof, whereby the foils are spaced from each other but clamped together with the spacer members by the utilized clamping elements. This arrangement ensures that the internal friction, which would otherwise occur with no spacers, is kept to a minimum.

For improving the flexibility of the foils so as to enable them to pass more easily over obstructions, such as girth welds, in the pipeline, the individual foils may be provided with slits extending partway inwardly from the outer edges thereof which, in use, are arranged to engage the inner surface of the pipeline wall, and they will preferably have a radius of curvature substantially the same as the diametral radius of curvature of the pipeline bore.

In order to provide adequate area of contact between the coupling members of the magnet assembly and the internal surface of the pipeline when the inspection vehicle is traversing a bend in the pipeline, at least the end stacks, in the case of a plurality of stacks, or the ends of a single stack, are preferably chamfered so as to define a substantially convex longitudinal outer surface profile to the coupling member. This convex profile also assists in reducing axial shock, and therefore damage, to the coupling members as the inspection vehicle encounters obstructions in the pipeline wall.

The clamping elements can take any convenient form, for example, the base portions of the stack or stacks can be located between bar or block members and the assembly thus formed being bolted tightly together by removable bolts which pass through suitably shaped apertures provided in the foils and bar members.

To facilitate the production of the desired convex longitudinal outer surface profile to the coupling members from foils of common shape stamped from continuous strip material, the noted apertures in the foils are of predetermined radially elongated length, enabling the foils to be assembled against a template of appropriate profile before the axial bolts are tightened to clamp the assembly of stack or stacks and bar members together, and the surplus foil material subsequently machined off the base of the assembly to provide a flat surface to match the surface of the permanent magnet to which the coupling is removably secured by bolting.

The foils, and possibly also the spacer members, will be made of ferro-magnetic metal or metal alloy which itself could be corrosion resistant or additionally or alternatively coated with a corrosion-resistant material. Also, at least the outer edges of the foils, which in use engage the pipeline wall, may be heat treated or coated with a suitable material to improve resistance to abrasive wear.

DESCRIPTION OF THE DRAWINGS

The invention will now be described by way of example with reference to the accompanying drawings in which.

DETAILED DESCRIPTION OF THE PREFERRED EMBODIMENTS

Figure 1:
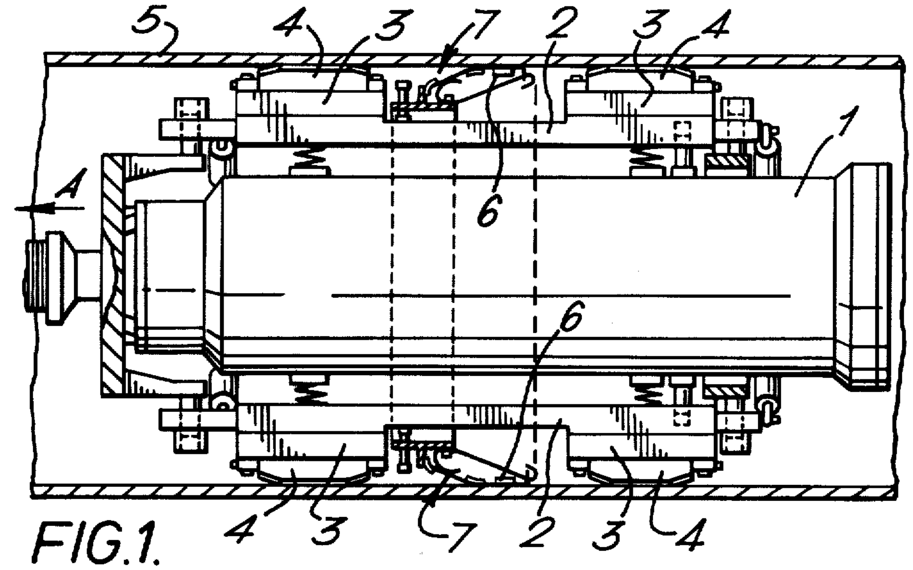
FIG. 1 is a diagrammatic illustration of a pipeline inspection vehicle incorporating a plurality of magnet assemblies in accordance with the invention.
Figure 2:
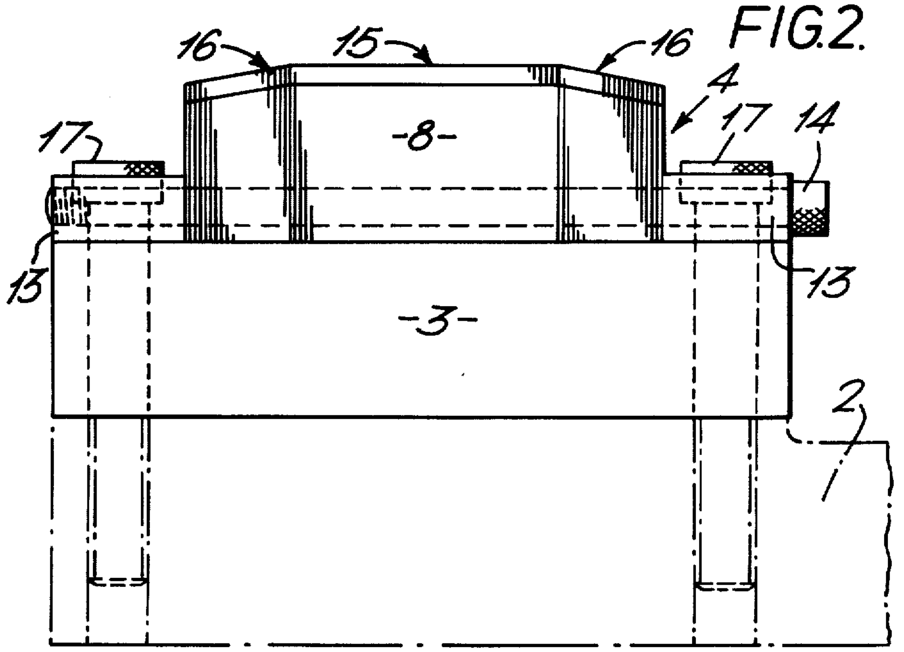
FIG. 2 is a side elevation of one of the magnet assemblies shown in FIG. 1.
Figure 3:
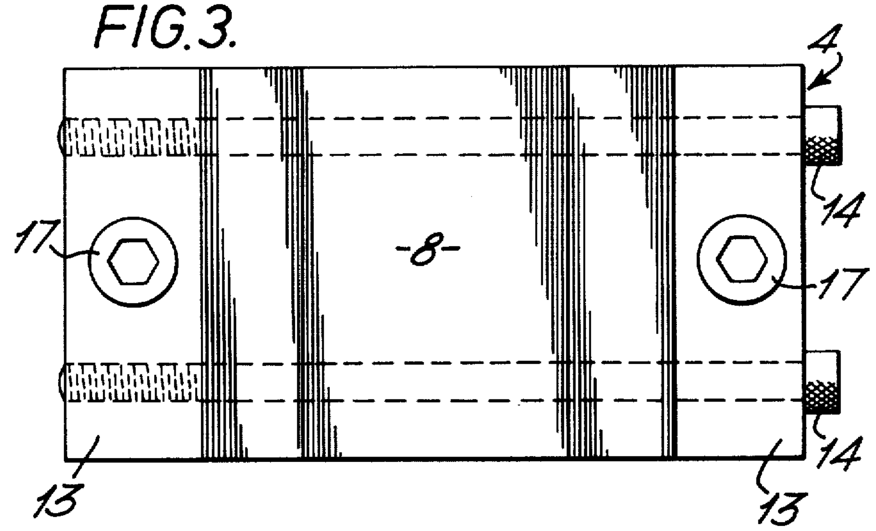
FIG. 3 is a plan view of FIG. 2.

Referring first to FIG. 1, the magnetic trailer vehicle of a pipeline inspection vehicle consists generally of a body 1 encircled by a plurality of spring-loaded magnetic return path segments 2 having at each end thereof a magnet assembly consisting of a powerful permanent magnet 3 and a coupling member 4 which will induce a relatively strong magnetic field in the region of the pipeline wall 5 under examination. The magnetic lines of force are constrained within the ferromagnetic pipeline wall, but where a fault or defect occurs there is a higher leakage field which is detected by sensors in a plurality of detector modules 6 which are carried by sledge units 7.

Figure 4:
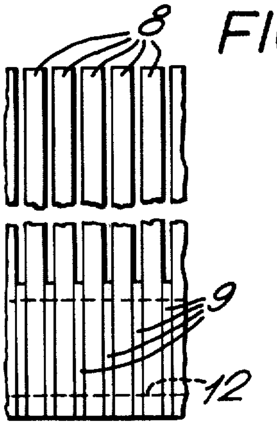
FIG. 4 is an enlarged diagrammatic side view of part of a stack of foils of a coupling member forming part of the magnet assembly.
Figure 5:
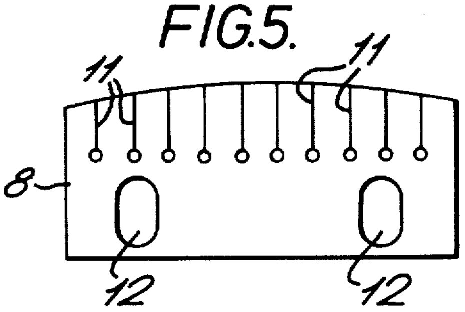
FIG. 5 is a face view of an individual foil of a stack of foils.

Referring also to FIGS. 2 to 5, each magnetic coupling member 4 comprises a single stack of a plurality of foils 8 each made, for example, from 0.127 mm thick carbon spring steel or an iron/nickel/chrome alloy, the foils being interleaved by spacer strips 9, preferably made from 0.076 mm thick ferromagnetic metal or metal alloy, the strips 9 being interposed between the base regions of the foils 8 so that the upper portions thereof are spread apart and therefore free to flex without any undue frictional engagement with one another (see FIG. 4). The flexibility of the foils is further improved by slits 11 which extend inwardly from their outer edges (see FIG. 5). Apertures 12 are provided in the foils and spacers, the apertures 12 in the foils being elongated so as to enable the outer longitudinal profile of the stack of foils to be formed against a template. Thus formed, the foils and spacers are clamped together between two end bars or blocks 13 by means of bolts 14 whereby the outer profile takes the form of a substantially longitudinally convex surface defined by a flat central surface portion 15 and end chamfered surface portions 16 (see FIG. 2). The overhanging base ends of the foils being machined off to provide a flat base to the stack. The outer edge of each foil 8 has a radius of curvature substantially the same as the radius of curvature of the pipeline bore (see FIG. 5).

The foils may be protected against corrosion by a suitable material coating, for example, oil, molybdenum-sulphide or polytetrafluorethylene. The resistance to abrasive wear of at least the outermost regions of the foils can be provided by heat treatment, for example, induction flame hardening, or by a coating, for example, with chromium oxide.

The magnetic coupling members 4 thus assembled are secured to the permanent magnets 3 and, in turn, to the segments 2 by means of bolts 17 which screw into the segments 2. Thus, to replace a worn or damaged foil stack of a magnet assembly, it is quite easy to detach the coupling member 4 by removing the bolts 17, remove the bolts 14 from the bars 13, and re-assembling a fresh set of foils 8 in the manner already described.

Figure 6:
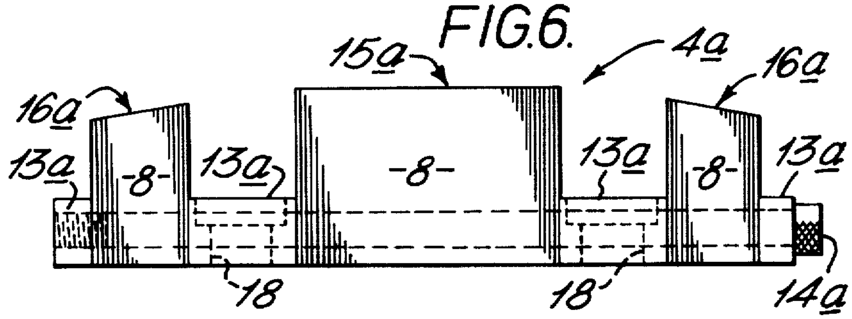
FIG. 6 is a side elevation, similar to FIG. 1, of an alternative arrangement of stacks for a magnet assembly.

The alternative arrangement of a magnetic coupling member 4*a* shown in FIG. 6 differs only from that already described in that three stacks of foils are provided, the centre stack providing the flat central surface portion 15*a* and the two end stacks providing the end chamfered surface portions 16*a*. In this case, the clamping means will include four bars or blocks 13*a*, the assembly of bars and stacks of foils being clamped together by bolts 14*a*, and the assembly thus formed being secured to the permanent magnet 3 and segment 2 by bolts (not shown) which are inserted through holes 18 in the two innermost bars 13*a*.

It will be seen that by using a magnet assembly in accordance with the invention, the convex surface profile of the coupling members 4 or 4*a* at each end of each magnetic return path segment 2 ensures adequate magnetic coupling with the pipeline wall when the inspection vehicle is traversing a bend in the pipeline.

We claim:

1. A magnetic coupling member which is capable of attachment to a magnet so as to form a magnet assembly for use on a pipeline inspection vehicle, said magnetic coupling member including
   - a plurality of thin, generally rectangular low magnetic reluctance metallic foils which are aligned with one another for conducting magnetic flux, each foil having a side edge along its elongated dimension labeled a bottom edge and an opposite side edge for contacting the internal surface of said pipeline and labeled a top edge,
   - a plurality of generally rectangular spacer strips, a separate spacer strip being positioned between each pair of foils to thereby form a stack, said spacer strips having narrower widths, than said foils and being positioned near the bottom edges of said foils such that the top edges of said foils are free to bend,
   - means for clamping together said foils near their bottom edges and said spacer strips in said stack, and
   - means for attaching said stack to the magnet of a magnet assembly.

2. The magnetic coupling member of claim 1, wherein each of said foils has at least one aperture therein and each of said spacer elements has at least one aperture therein, the apertures in said foils and said spacer elements being aligned to form a hole through said stack, and wherein said means for clamping together said foils and spacer strips in said stack comprise at least one threaded bolt which extends through each hole in said stack.

3. The magnetic coupling member of claim 2 wherein said means for clamping together said foils and spacer strips in said stack also includes blocks positioned against the opposite ends of said stack, said blocks having holes therethrough which are aligned with the holes extending through said stack, each said threaded bolt extending through a hole in one block, through the associated aligned hole in the stack, and at least partially through the hole in the block at the opposite end of the stack.

4. The magnetic coupling element of claim 3, wherein the hole in the block at the opposite end of the stack is internally threaded and is threadingly engaged with the threaded end of the bolt extending therein.

5. The magnetic coupling element of claim 3, wherein said blocks have additional holes therethrough which extend perpendicularly to the holes therein in which said bolts extend, and wherein said means for attaching said stack to the magnet of a magnet assembly comprises bolts extending through said additional holes.

6. The magnetic coupling element of claim 1, wherein each of said foils includes spaced apart slits which extend through the thickness of each foil and from the top edge downwardly towards the bottom edge.

7. The magnetic coupling element of claim 1, wherein the top edges of the foils are curved.

8. The magnetic coupling element of claim 1, wherein the foils in a center portion of said stack have equal widths whereas said foils near the opposite ends of said stack have gradually decreasing widths, thereby forming a stack, when viewed in side cross section, with chamfered ends along its top.

9. The magnetic coupling element of claim 1, wherein said magnetic foils are made of materials selected from the group consisting of steel or an iron/nickel/chrome alloy.

10. The magnetic coupling element of claim 1, wherein said foils are coated with a corrosion-resistant material.

11. The magnetic coupling element of claim 1, wherein the top edges of said foils are flame hardened so as to be abrasion-resistant.

12. The magnetic coupling element of claim 1, wherein the top edges of said foils are coated with chromium oxide so as to be abrasion-resistant.

13. The magnetic coupling element of claim 1, wherein the magnetic coupling element includes multiple stacks of clamped together foils and spacer elements.

14. A magnetic assembly useful in a pipeline inspection vehicle, said magnetic assembly comprising a magnetic coupling element as defined in claim 1 attached to a permanent magnet.

15. A pipeline inspection vehicle which includes a multiplicity of magnetic assemblies mounted around a vehicle body, each said magnetic assembly comprising a magnetic coupling element as defined in claim 1 attached to a permanent magnet.

* * * * *